(12) United States Patent
Zuck et al.

(10) Patent No.: US 7,541,094 B1
(45) Date of Patent: Jun. 2, 2009

(54) FIREPOLISHED QUARTZ PARTS FOR USE IN SEMICONDUCTOR PROCESSING

(75) Inventors: David S. Zuck, Coppell, TX (US); Gregory H. Leggett, Allen, TX (US)

(73) Assignee: Quantum Global Technologies, LLC, Dublin, PA (US)

( * ) Notice: Subject to any disclaimer, the term of this patent is extended or adjusted under 35 U.S.C. 154(b) by 70 days.

(21) Appl. No.: 11/712,802

(22) Filed: Feb. 28, 2007

Related U.S. Application Data

(60) Provisional application No. 60/779,009, filed on Mar. 3, 2006.

(51) Int. Cl.
- *B32B 9/04* (2006.01)
- *B32B 13/04* (2006.01)
- *C23G 1/02* (2006.01)
- *C23F 1/00* (2006.01)
- *H01L 21/306* (2006.01)
- *B44C 1/22* (2006.01)
- *C03C 15/00* (2006.01)
- *C03C 25/68* (2006.01)

(52) U.S. Cl. .................. 428/446; 134/3; 156/345.15; 156/345.12; 216/31; 216/52; 216/83; 216/88; 438/905

(58) Field of Classification Search .............. 134/3; 156/345.1, 345.12; 216/31, 52, 83, 88; 438/905; 428/446

See application file for complete search history.

(56) References Cited

U.S. PATENT DOCUMENTS

| | | | |
|---|---|---|---|
| 2002/0102775 A1* | 8/2002 | Houng et al. | 438/143 |
| 2004/0045574 A1* | 3/2004 | Tan | 134/1 |
| 2004/0238487 A1* | 12/2004 | Kiehlbauch et al. | 216/52 |
| 2005/0045209 A1 | 3/2005 | Tan | |
| 2005/0274396 A1* | 12/2005 | Shih et al. | 134/29 |

FOREIGN PATENT DOCUMENTS

JP    2008-031038    *  2/2008

OTHER PUBLICATIONS

Japanese Machine translation of JP 2008-031038 provided by the JPO website. Translation date of Jan. 4, 2009.*

(Continued)

*Primary Examiner*—Timothy M Speer
*Assistant Examiner*—Jonathan C Langman
(74) *Attorney, Agent, or Firm*—Arthur J. Behiel; Joyce Lauer; Silicon Edge Law Group LLP

(57) ABSTRACT

Described are methods and chemistries for preparing firepolished quartz parts for use in semiconductor processing. The quartz parts in need of preparation include newly manufactured parts as well as parts requiring refurbishment after previous use in semiconductor processing. The embodiments described avoid methods and chemistries that may damage the surfaces of the quartz parts and render the parts unfit for use in semiconductor processing. A method in accordance with one embodiment minimizes damage by limiting exposure of the quartz parts to hydrofluoric acid. A quartz part for use in semiconductor processing comprises a surface including a surface portion having a surface portion area to expose to a gas, wherein at least 95 percent of the surface portion area is free of defects and wherein the surface portion has less than E12 atoms per centimeter squared of aluminum.

8 Claims, 8 Drawing Sheets

OTHER PUBLICATIONS

Liang, Da-Tung et al., "Dissolution Kinetics of Crystalline and Amorphous Silica in Hydrofluoric-Hydrochloric Acid Mixtures." Journal of American Ceramic Society, vol. 70, No. 8, pp. 570-577, 1987.

"Fused Quartz Properties & Usage Guide. GE Type 214, 214LD and 124". Downloaded from http://www.quartz.com/gedata.html. Copyright 1995 General Electric Company. Revised Wednesday, Oct. 11, 2000, 6 pages.

Momentive performance materials Help/FAQs. Downloaded from http://www.gequartz.com/en/help.htm. Copyright 1997-2002 General Electric Company. 2 pgs.

Materials Handling of Quartz. Downloaded from http://www.tosohquartz.com/engineering4.html. Downloaded Nov. 12, 2005. 2 pgs.

\* cited by examiner

FIREPOLISHED QUARTZ PARTS FOR USE IN SEMICONDUCTOR PROCESSING

CROSS-REFERENCE TO RELATED APPLICATIONS

The present application claims the benefit under 35 U.S.C. §119 of Provisional Application Ser. No. 60/779,009, filed Mar. 3, 2006. The above-referenced application is incorporated by reference herein.

BACKGROUND

Semiconductor devices are built up using a number of material layers. Each layer is patterned to add or remove selected portions to form circuit features that will eventually make up an integrated circuit. To pattern a layer by removal of material, a mask is first formed on the layer using photolithographic techniques. The exposed portions of the layer that lie between the features of the patterned mask are then removed by etching. Dry etching is superior to wet etching for patterning very small circuit features. Dry etching includes chemical techniques such as plasma etching and physical techniques such as sputter etching.

A typical plasma etching apparatus includes a processing chamber which encloses the semiconductor wafers that are to be etched. In the etching process, an energy source activates fluorine-based or chlorine-based gases to form a plasma (ionized gas) containing a number of reactive species. The plasma reacts chemically with the surface layer of the wafer in areas not covered by the mask. Atoms in the surface layer combine with reactive species in the plasma to form volatile products. The volatile products depart the surface layer and are pumped away, resulting in removal of the surface layer in areas not covered by the mask.

Not all of the volatile products are pumped away, unfortunately. Some of the volatile products condense to form a film of process residue on surfaces of the processing chamber and on other parts within the plasma etching apparatus. With continued use of the plasma etching apparatus, the film of process residue can begin to flake off, releasing particles that threaten to induce defects on the wafers being processed. To eliminate these particles, the processing chamber and other parts must be periodically cleaned or replaced.

The methods and chemicals used to clean the processing chamber and other parts depend upon the composition of the process residue to be removed. To remove polysilicon, for example, a 1:1 solution of hydrofluoric acid and nitric acid is typically used. The nitric acid first reacts with the polysilicon to oxidize it and produce silicon oxide. The silicon oxide is then removed by the hydrofluoric acid. Hydrofluoric acid is also used to remove metals.

Refurbishing processing chambers and other parts for use in plasma etching entails more than removing process residue from those parts. It may also be advantageous to repair any damage to the surface of the parts caused by exposure to highly reactive plasmas. The processing chamber typically is made of aluminum, glass or quartz. Quartz is also commonly used for other parts of the plasma etching apparatus. A plasma that is sufficiently reactive to etch silicon wafers will also etch quartz, which is a form of silicon dioxide. Plasma etching erodes quartz, changing a smooth transparent surface to a rough surface having a "frosted" appearance.

Etched quartz tends to release small particles from its surface, a process that is called spalling or spallation. Quartz is formed of small crystallites joined in a matrix. When quartz is etched, the etching proceeds faster in localized areas between the crystallites, resulting in undercutting of the unetched crystallites. Those crystallites are then liberated from the matrix and released as particles. As in the case of process residue particles, quartz particles can cause defects in the wafers to be processed.

Firepolishing is generally used to restore etched quartz surfaces. When firepolishing a part made of quartz or any glass, the aim is to melt the surface of the part without melting the bulk of the part underlying the surface. A flame is often used in firepolishing, but is not required. Localized surface melting reduces the microscopic roughness of the surface, thereby reducing the release of quartz particles, and restores a smooth transparent appearance.

Refurbishing of plasma etching apparatus parts typically includes removal of process residue, firepolishing, and a final cleaning with hydrofluoric acid. As noted above, hydrofluoric acid, alone or in combination with other agents, is commonly used to clean quartz parts. For cleaning quartz, hydrofluoric acid is typically used at a concentration of 5 to 15 percent. Hydrofluoric acid is favored for cleaning quartz because it removes a wide variety of contaminants, including certain metal contaminants such as aluminum which are difficult to remove. One reason why hydrofluoric acid is effective at cleaning quartz is that hydrofluoric acid reacts chemically with the surface of the quartz, resulting in removal of silicon and oxygen atoms from the surface. Removal of these atoms from the surface of the quartz also dislodges contaminants adhered to those surface atoms.

Hydrofluoric acid is commonly used in the manufacturing of new quartz parts, both for cleaning subparts at intermediate stages of assembly and for removing manufacturing contaminants from newly manufactured quartz parts. Surfaces of new quartz parts commonly bear aluminum and other contaminants which can damage silicon wafers, so the new quartz parts typically are cleaned thoroughly before they are used in semiconductor processing.

Quartz parts are used in many types of semiconductor processing besides plasma etching processes. For example, quartz parts may be used in chemical vapor deposition (CVD) and physical vapor deposition (PVD) processes. Process residue, including metal contaminants, may accumulate on quartz parts used in various types of semiconductor processing. Cleaning and refurbishing may be required for quartz parts used in various types of semiconductor processing.

Both new and refurbished quartz parts typically are tested thoroughly before they are used in semiconductor processing. Testing of new and refurbished parts includes measurement of metals to ensure that metal contaminants do not exceed permitted levels. Testing of quartz parts also includes measurement of particle release in process. Unfortunately, refurbished quartz parts often show unacceptably high release of particles in process, rendering the parts unusable. Furthermore, newly manufactured quartz parts sometimes show unacceptably high release of particles. There is a need for refurbished and new quartz parts with low levels of metal contaminants and with consistently low release of particles in process.

DETAILED DESCRIPTION

Figure 1:
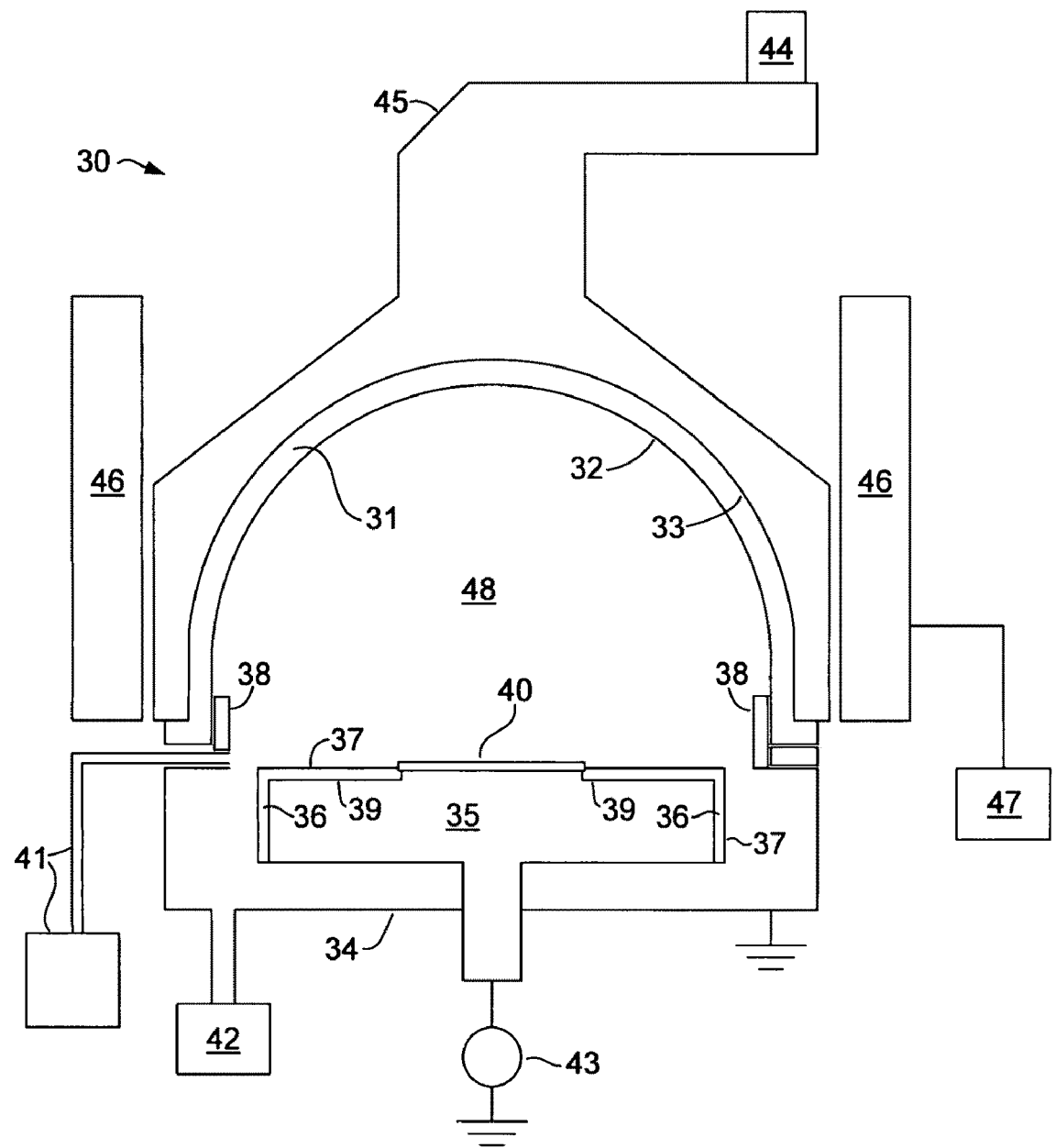
FIG. 1 is a vertical-section view of an apparatus for use in semiconductor processing, in accordance with an embodiment.

FIG. 1 is a vertical-section view of an apparatus 30 for use in semiconductor processing, in accordance with an embodiment. Apparatus 30 is depicted at a time when apparatus 30 is ready for use in semiconductor processing, but prior to such use. Thus, some parts of apparatus 30 may have been cleaned and/or refurbished in preparation for use. Apparatus 30 comprises a bell jar 31 and a wall 34 that together form a processing chamber enclosing a chamber interior 48. Apparatus 30 further comprises a substrate electrode 35 protected by an electrode cover 36, a ground electrode 38, a gas source 41, and a vacuum unit 42. A semiconductor substrate or wafer 40 rests upon substrate electrode 35.

Apparatus 30 includes one or more quartz parts, each quartz part comprising a surface. Any of the quartz parts in apparatus 30 may be a refurbished quartz part. In the embodiment of FIG. 1, bell jar 31 is a quartz part. The surface of bell jar 31 includes a bell jar inner surface portion 32 to expose to a plasma during semiconductor processing and a bell jar outer surface portion 33. A surface to expose to a gas, such as bell jar inner surface portion 32, may have been previously etched by a plasma during semiconductor processing and then firepolished to repair the plasma-etched surface portion. In another embodiment, apparatus 30 may comprise a different quartz part; for example, electrode cover 36 may be a quartz part. The surface of electrode cover 36 includes an electrode cover outer surface portion 37 to expose to a gas during semiconductor processing and an electrode cover inner surface portion 39. In another embodiment, apparatus 30 may comprise a quartz part where the surface portion to expose to a gas corresponds to the entire surface of the quartz part.

A quartz part having a surface portion to expose to a gas during semiconductor processing typically is tested before installation of the quartz part in apparatus 30. Typical tests include measuring metals and measuring particle release and/or surface damage that may result in particle release. Bell jar inner surface portion 32 has an inner surface portion area that is or will be exposed to a plasma. At least 95 percent of the inner surface portion area is free of defects. In another embodiment, at least 99 percent of the inner surface portion area is free of defects. Defects may lead to release of quartz particles. The method for determining that a surface portion area is free of defects is described below in connection with FIGS. 3-8. In addition to being largely free of defects, bell jar inner surface portion 32 has very low levels of metals such as aluminum, copper, iron, sodium, and potassium. In one embodiment, bell jar inner surface portion 32 has an average contamination concentration of at most E12 atoms per centimeter squared of aluminum. In another embodiment, bell jar inner surface portion 32 has a contamination level of at most E11 atoms per centimeter squared of aluminum. In another embodiment, bell jar inner surface portion 32 also has very low contamination levels for copper, iron, sodium, and potassium; for each of the listed metals, bell jar inner surface portion 32 has less than E12 or less than E11 atoms per centimeter squared. The method for determining that a surface portion has at most an allowed average contamination level for various metallic contaminants is described below in connection with Table 1.

In the embodiment of FIG. 1, apparatus 30 is for use in plasma etching. During operation of apparatus 30, microwaves generated by magnetron 44 are transferred to waveguide 45 and launched into chamber interior 48 through bell jar 31, forming an electric field. DC power supply 47 and solenoid coil 46 form a magnetic field. Gas fed to chamber interior 48 from gas source 41 is ionized to form a plasma by the electric field and the magnetic field, and the plasma etches wafer 40. In other embodiments for use in other types of semiconductor processing, apparatus 30 may be modified in various ways. For example, a different energy source might be used in place of magnetron 44, waveguide 45, solenoid coil 46, and DC power supply 47. In another embodiment, apparatus 30 may be used for metal deposition. In such an embodiment, the gas within chamber interior 48 is a metal vapor, and the gas source 41 is a metal evaporation device such as a filament evaporation device or an induction evaporation device.

Figure 2:
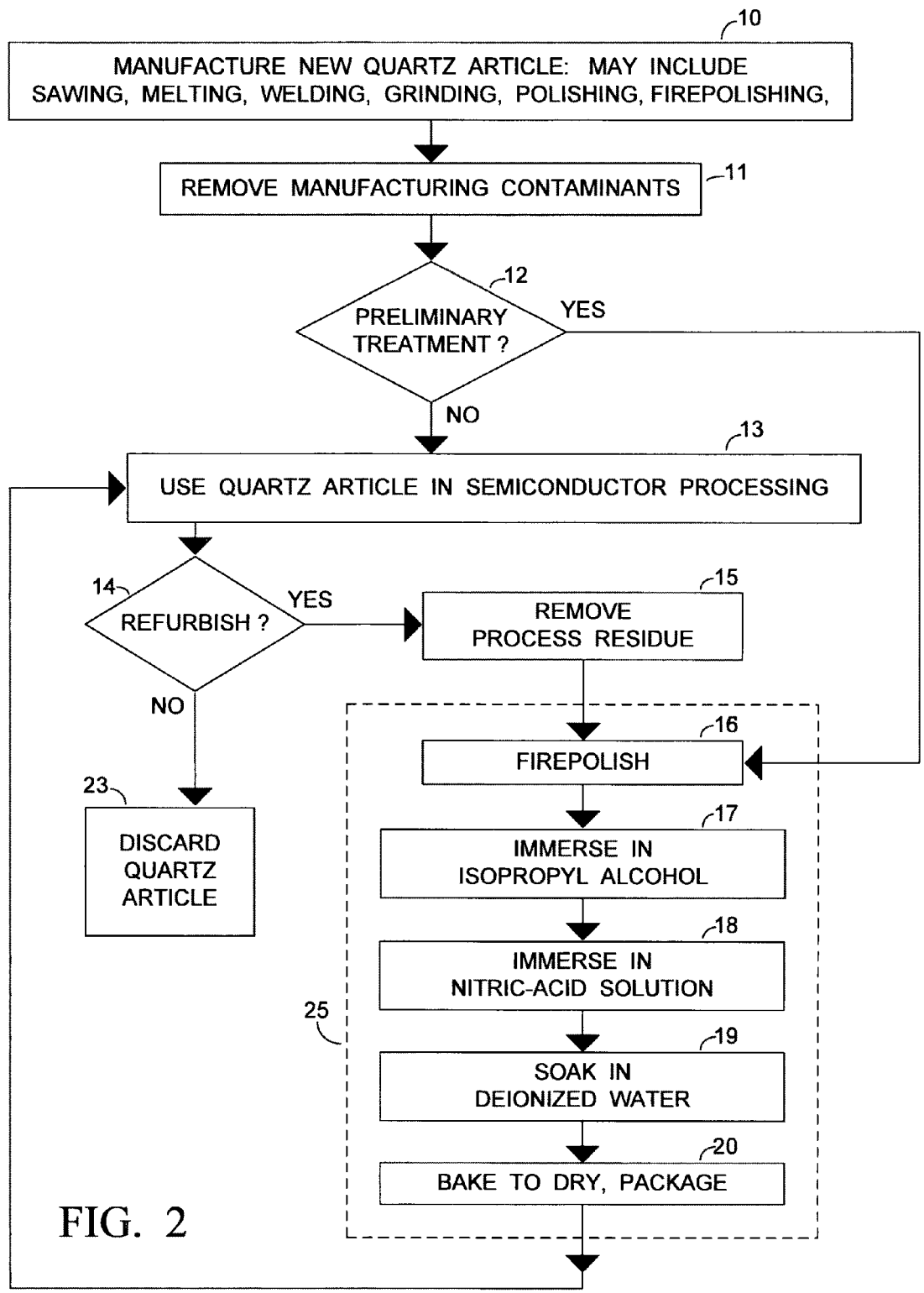
FIG. 2 is a simplified flowchart that depicts the lifecycle of a quartz part and a method 25 in accordance with an embodiment for protecting a quartz part from damage while preparing the part for use in semiconductor processing.

FIG. 2 is a simplified flowchart that depicts the life cycle of a quartz part that is used in semiconductor processing. Initial manufacturing (step 10) of the quartz part may include any of the following steps: sawing, melting, welding, grinding, polishing and firepolishing. Before a new quartz part is used in semiconductor processing (step 13), manufacturing contaminants may be removed (step 11) using a precleaning process. In one embodiment, the new quartz part is precleaned using aqua regia, which is a 3:1 mixture of hydrochloric acid and nitric acid. Typically, the aqua regia used for precleaning quartz includes about 15 percent hydrochloric acid and 5 percent nitric acid, and the precleaning period is one hour. Aqua regia removes most metals, including gold and aluminum, and thus may be useful for precleaning new quartz parts which commonly bear metal contaminants.

The new quartz part may be used directly in semiconductor processing (step 13). Alternatively, one may choose (step 12) to treat the part using methods described herein prior to using the part in semiconductor processing.

The surface of a quartz part that is used in semiconductor processing (step 13) eventually becomes contaminated and damaged. At that point, the part may be discarded (step 23). Alternatively, one may choose (step 14) to refurbish the part using methods described herein.

A quartz part that is to be refurbished may be contaminated with process residue that was deposited on the part during the semiconductor processing. Some quartz parts bear little process residue; the lack of residue on these parts may reflect an equilibrium between deposition of residue and removal of residue by subsequent processing. The process residue may include metals, silicon and silicon compounds, chlorine and fluorine from etching plasmas, and materials derived from photoresist polymers. It may be advantageous to remove the process residue (step 15) using a precleaning process. In one embodiment, isopropyl alcohol or acetone is used to preclean the part. In another embodiment, the part is precleaned using a solution that includes between about 5 and 15 percent hydrofluoric acid.

A method 25 in accordance with one embodiment prepares quartz parts for use in a plasma etching process. The method 25 may also be used to prepare quartz parts for use in other types of semiconductor processing. The method 25 may be used both for new parts and for parts to be refurbished. In some embodiments, the quartz parts are precleaned as described above for step 11 or step 15 before being prepared by method 25. Method 25 begins with firepolishing (step 16) the surface of the part. When a quartz part is used in a plasma etching process, the surface of the part becomes rough and irregular due to etching of the quartz by the reactive plasma. A surface of a quartz part may also be damaged or etched by reactive chemical species used in other types of semiconductor processing. Firepolishing (step 16) restores a smooth transparent surface that is less prone to releasing particles and that offers less surface area for contaminants to adhere to.

After firepolishing (step 16), the part may be cleaned (step 17) to remove hydrocarbon-bearing contamination that may be present. In the method 25 in accordance with one embodiment, the part is cleaned (step 17) by immersion in isopropyl alcohol for about 10 to 15 minutes.

In the next step (step 18), the part is processed to remove contaminants, such as metals, that could cause problems in semiconductor processing. Conventional methods of processing quartz parts to remove contaminants commonly employ chemistries that include hydrofluoric acid at a concentration of 5 to 15 percent. Unfortunately, quartz parts processed by these conventional methods often exhibit high levels of particle release in process and are thus unsuitable for use in semiconductor processing.

Applicants developed a process for refurbishing quartz parts without causing damage that renders the parts unfit for use in semiconductor processing. This process employs a chemistry that avoids the use of hydrofluoric acid. In the method 25 in accordance with one embodiment, the quartz part is immersed in a nitric-acid solution (step 18) to expose the surface of the part to nitric acid. The nitric-acid solution is e.g. a mixture of nitric acid and deionized water. The mixture may include from about 10 to 70 percent nitric acid, the balance being deionized water. The nitric acid is purchased as a stock solution which is a mixture of 70 percent nitric acid and 30 percent water. The nitric acid stock solution is a purified grade of nitric acid solution intended for use in semiconductor processes (sometimes called "semi grade"); preferably the nitric acid stock solution is an even purer grade intended for use in semiconductor clean rooms (sometimes called "VLSI grade"). A typical nitric-acid solution including 35 percent nitric acid is prepared by mixing one part of the nitric acid stock solution and one part deionized water. The nitric-acid solution may include as much as 70 percent nitric acid; such a solution consists of nitric acid stock solution with no addition of water. Removal of contaminants typically is achieved by immersion of the quartz part in the nitric-acid solution for at least 15 minutes and preferably for 30 minutes or longer.

After treatment with nitric-acid solution (step 18), the quartz part is soaked in deionized water (step 19) for about one-half to one hour. The quartz part is then dried by baking (step 20) at about 110 degrees centigrade for about one hour, and is then bagged in a clean room. The new or refurbished part is now ready for inclusion in semiconductor processing equipment.

Applicants have discovered that preventing exposure of quartz parts to hydrofluoric acid results in lower release of particles from the parts in process, rendering the parts suitable or more suitable for use in semiconductor processing. Exposure to hydrofluoric acid is minimized throughout a critical period that preferably begins when the part is firepolished and extends until a time when the part is used in semiconductor processing. In the method 25 that is depicted in FIG. 2, the critical period begins at firepolishing (step 16) and extends through baking and packaging in a clean room (step 20). To minimize exposure of the part to hydrofluoric acid, any solution contacting the part during the critical period has a hydrofluoric acid concentration that is less than about one percent. Preferably the hydrofluoric acid concentration is zero percent. In another embodiment, a ratio of a nitric acid concentration for the solution to the hydrofluoric acid concentration is greater than 50. For example, the ratio may be 1000.

Applicants speculate that exposure to hydrofluoric acid, or heating followed by exposure to hydrofluoric acid, damages the surface of a quartz part resulting in release of particles in process. Embodiments described herein avoid such damage, leading to reduced discarding of quartz parts and significant cost savings for semiconductor manufacturers. One interpretation that is consistent with applicants' observed results is that firepolishing (step 16) repairs prior damage caused by semiconductor processing (step 13) and/or by hydrofluoric acid that may be used in precleaning (step 11 or step 15). Avoidance of hydrofluoric acid after firepolishing protects the repaired surface against new damage.

Quartz parts that are treated to remove contaminants typically are tested thoroughly before the parts are used in semiconductor processing. Testing of new and refurbished quartz parts typically includes measurement of metals to ensure that the concentrations of metal contaminants in the surface of the part do not exceed preferred values. Surface metal contaminants can be measured using methods detailed in U.S. patent application Ser. No. 11/323,120 entitled "Cleaning and Certification Methods for Reclaiming Copper-Contaminated Process Equipment for Aluminum Processes," by David S. Zuck and Gregory H. Leggett, which is incorporated herein by reference.

Table 1 lists metals (metal contaminants) that typically are measured on a quartz part surface portion that will be exposed to a gas or plasma in semiconductor processing. Other metals besides those listed in Table 1 may also be measured. For each metal, Table 1 states the allowed concentration of the metal for a quartz part surface portion that will be exposed to a gas in semiconductor processing. The allowed concentration is expressed as the number of metal atoms per centimeter squared (atoms/cm$^2$) of the surface portion. The allowed concentration for each metal is stated as two values, the Acceptable concentration and the Preferred concentration. Parts having test results that satisfy the Acceptable concentration may be usable in certain semiconductor processes that are less sensitive to metal contaminants, while parts having test results that satisfy the Preferred concentration may be advantageous for use in semiconductor processes that are especially sensitive to metal contaminants. Quartz parts treated using methods described herein typically satisfy the Preferred concentration. Prior to treatment, quartz parts that have been used in semiconductor processes typically are contaminated with all of the metals listed in Table 1, with each metal present at a concentration of greater than E13 atoms/cm$^2$.

TABLE 1

| Metal (symbol) | Allowed Concentration (atoms/cm$^2$) (Acceptable/Preferred) |
| --- | --- |
| Aluminum (Al) | less than E12/less than E11 |
| Copper (Cu) | less than E12/less than E11 |
| Iron (Fe) | less than E12/less than E11 |

TABLE 1-continued

| Metal (symbol) | Allowed Concentration (atoms/cm$^2$) (Acceptable/Preferred) |
| --- | --- |
| Sodium (Na) | less than E12/less than E11 |
| Potassium (K) | less than E12/less than E11 |

Testing of new and refurbished quartz parts may also include characterizing the parts with respect to particles. For characterizing a part with respect to particles, various methods or measuring devices might be used, including a Dryden QIII surface particle counter, a liquid particle counter (LPC), and scanning electron microscopy. Suitable particle detectors are available from Pentagon Technologies of Hayward, Calif. New and refurbished quartz parts might also be characterized by measuring particle or contaminant concentrations on the surfaces of wafers processed using those parts. Because the ultimate goal is to minimize wafer contamination, methods that characterize quartz cleanliness by measuring wafer-surface contamination may be preferred over those based upon measurements of the quartz surface. Methods for use in measuring particle and metal concentrations on wafer surfaces are well known to those skilled in the art.

Scanning electron microscopy may be used to visualize the surface of a quartz part and to detect surface damage or defects that are likely to cause release of particles. FIGS. 3-8 depict surfaces of quartz parts treated by various methods and visualized by scanning electron microscopy. As is evident from FIGS. 3-8, different treatment methods result in surfaces having very different levels of damage or defects. In particular, the percent of the surface portion area that is free of defects is much higher in surfaces treated with solutions that do not include hydrofluoric acid, compared to surfaces treated with solutions that do include hydrofluoric acid. Furthermore, as described below for FIGS. 5-8, visualization of defects may be influenced by the angle of incidence of the electron beam that is used to perform the scanning electron microscopy.

As used in this description and in the appended claims, the term "defect" means a feature that interrupts the plane of the surface and that is visible when the surface is viewed by scanning electron microscopy at a magnification of about 1,500× to 3,000×. Defects include features that interrupt the surface by appearing to protrude above the plane of the surface and features that interrupt the surface by appearing to recede below the plane of the surface. The features that interrupt the surface are visible using electron beams at various angles of incidence, including 30 degrees and 90 degrees. Many examples of defects are identified below in connection with FIGS. 3-8. When determining the percent of a surface portion area that is free of defects, it may be advantageous to visualize several different fields by scanning electron microscopy and to average the values for percent free of defects that are determined for the several fields.

Figure 3:
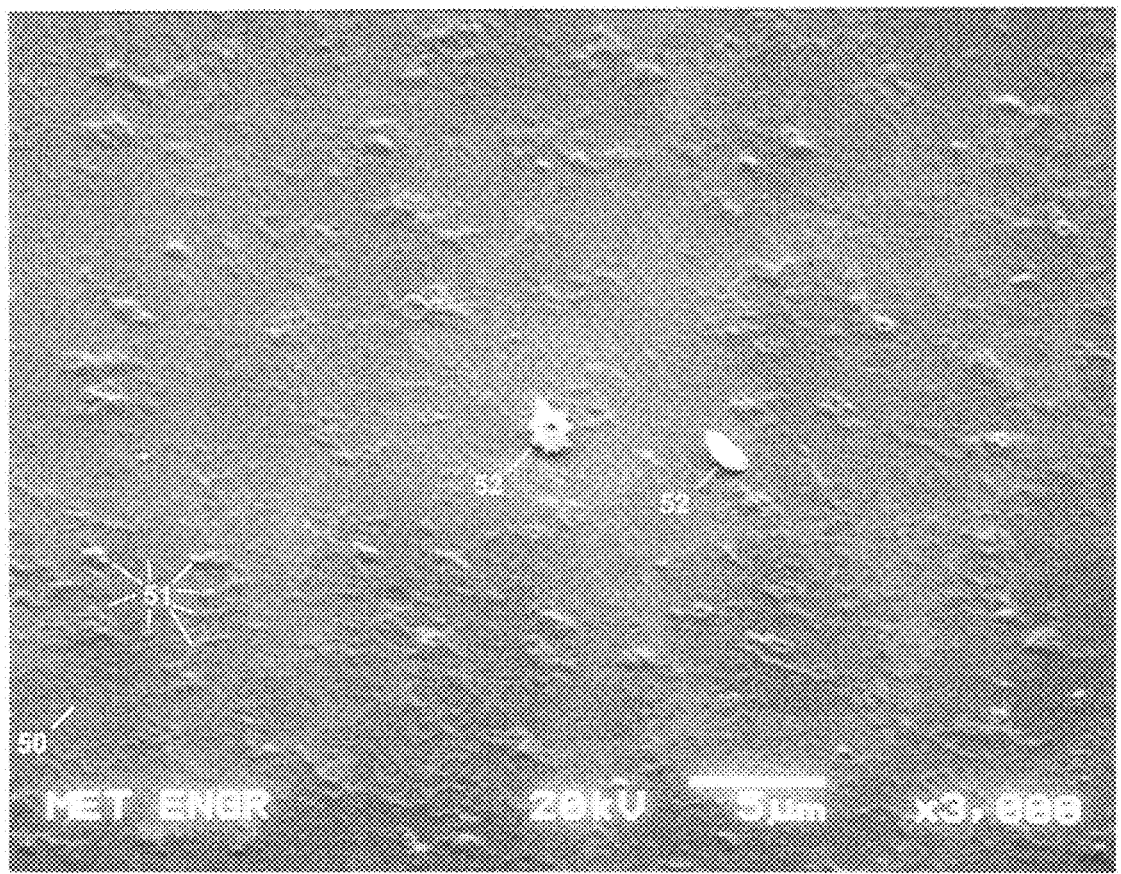
FIG. 3 is a scanning electron micrograph (SEM) of a quartz surface that was firepolished and then treated with hydrofluoric acid.

FIG. 3 (prior art) is a scanning electron micrograph (SEM) of a quartz surface that was firepolished and then treated with hydrofluoric acid. For the SEM of FIG. 3, the original magnification was 3000×. Numerous defects are apparent in the SEM. Several defects 51 are indicated at the lower left region of the SEM. For clarity, reference numerals are omitted for the remainder of the defects 51. Two large defects 52 are also indicated. The defects 51, 52 are interspersed with small patches that are free of defects. One such patch 50 that is free of defects is indicated at the lower left region of the SEM. For clarity, reference numerals are omitted for the remainder of the patches 50 that are free of defects. The fraction of the surface portion area that is free of defects is estimated to be at most 50 percent.

Figure 4:
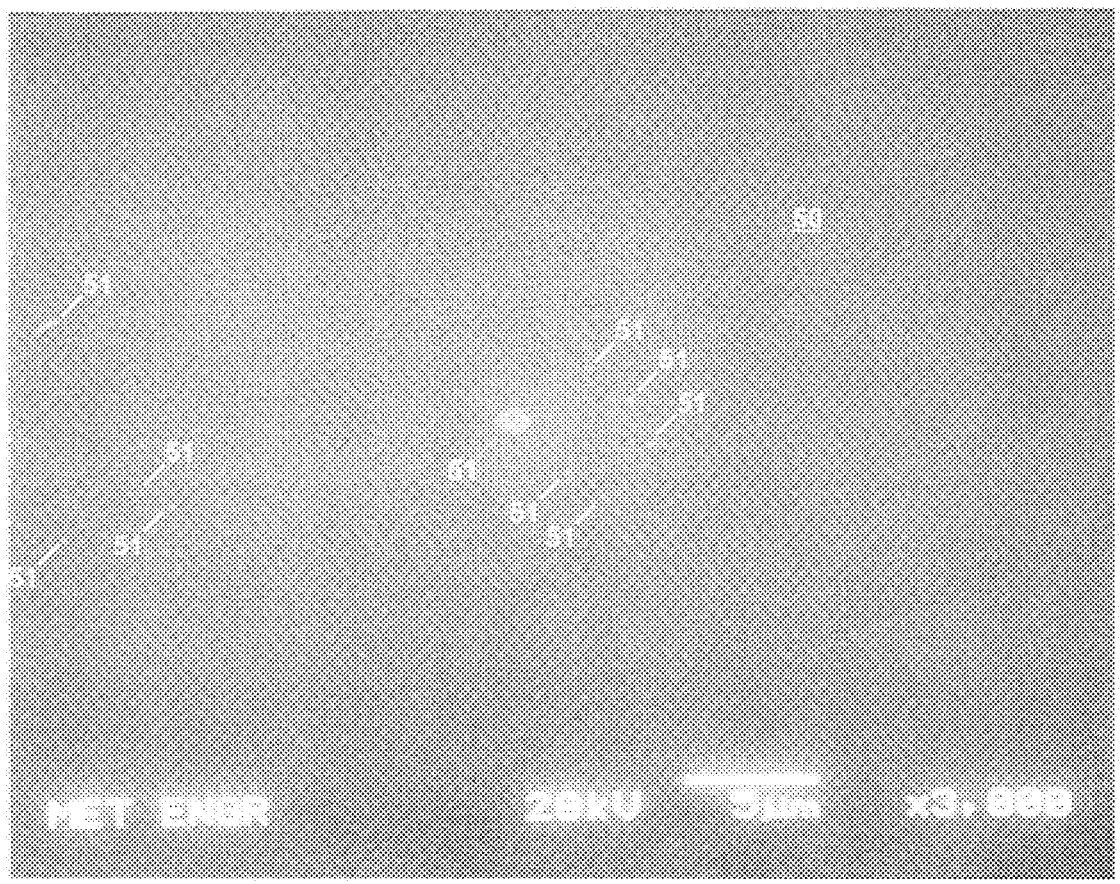
FIG. 4 is an SEM of a quartz surface that was firepolished and then treated with nitric acid.

FIG. 4 is an SEM of a quartz surface that was firepolished and then treated with nitric acid, in accordance with an embodiment. For the SEM of FIG. 4, the original magnification was 3000×. A large region 50 that is free of defects occupies most of the SEM. Several defects 51 are indicated. The fraction of the surface portion area that is occupied by the defects 51 is about 0.2 percent. Thus, the fraction of the surface portion area that is free of defects is about 99.8 percent. Comparing FIG. 3 and FIG. 4, it is clear that the percent of the surface portion area that is free of defects is much higher in FIG. 4 than in FIG. 3.

Figure 5:
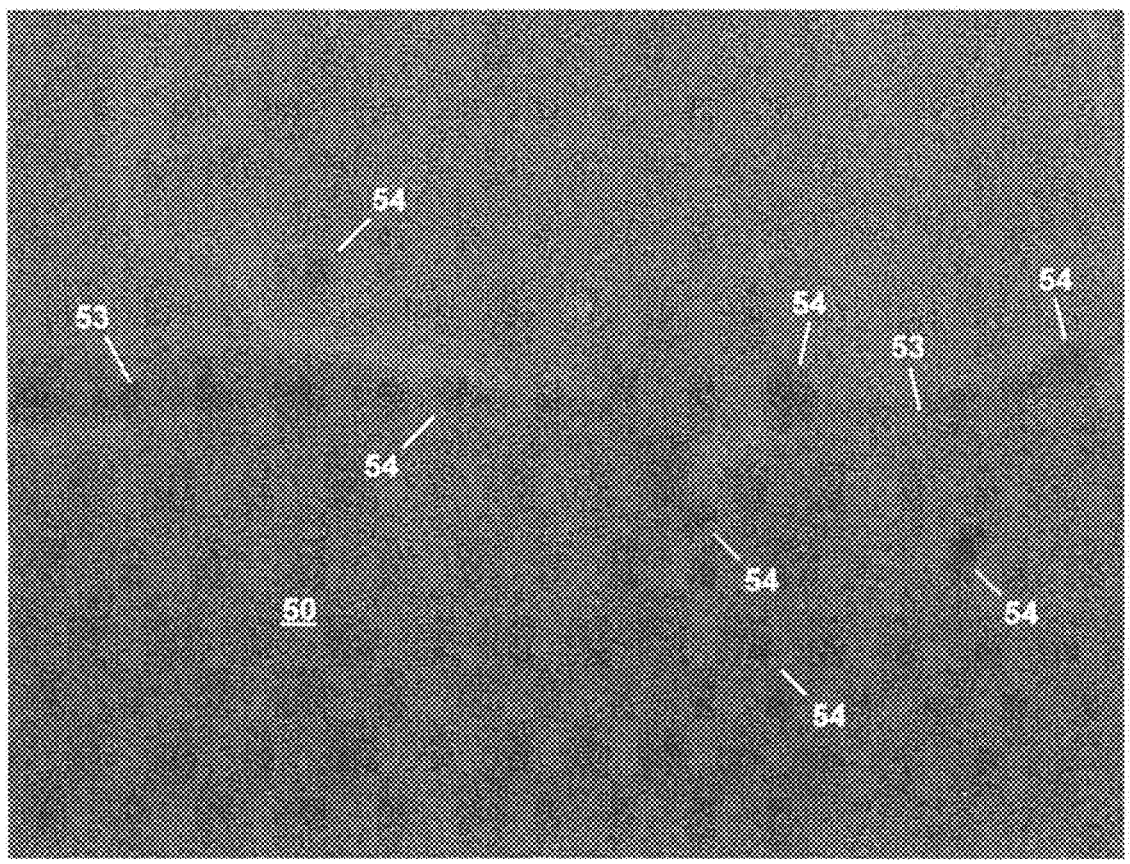
FIG. 5 is an SEM of a quartz surface that was firepolished and then treated with hydrofluoric acid; an electron beam at 90 degrees angle of incidence was used to produce the SEM.
Figure 6:
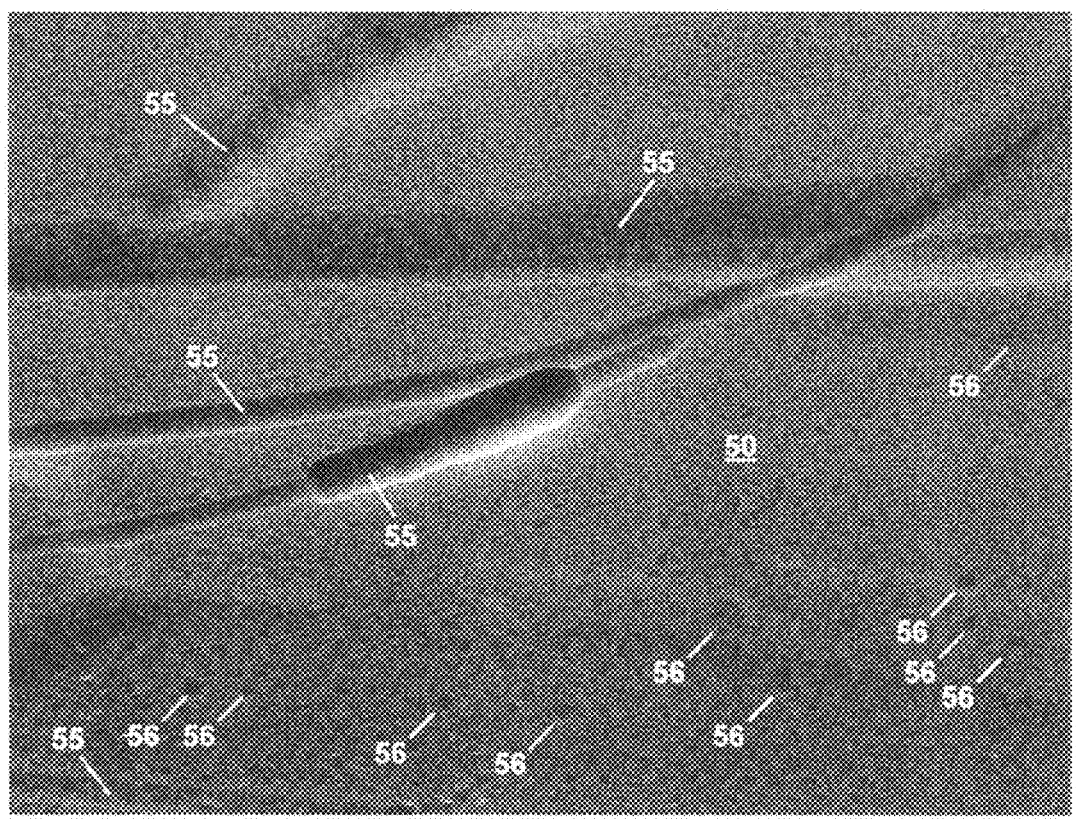
FIG. 6 is an SEM of a quartz surface that was firepolished and then treated with hydrofluoric acid; an electron beam at 30 degrees angle of incidence was used to produce the SEM.

FIGS. 5-8 present additional examples of SEMs for quartz surfaces that were firepolished and then treated to remove contaminants. For the SEMs of FIGS. 5-8, the magnification is approximately half as much as the magnification for the SEMs of FIGS. 3-4. FIG. 5 (prior art) is an SEM of a quartz surface that was firepolished and then treated with hydrofluoric acid; an electron beam at 90 degrees angle of incidence was used to produce the SEM. A large region 50 that is free of defects occupies much of the SEM. One elongate defect 53 and several circular defects 54 are indicated. Defects 53, 54 are not clearly resolved, making it difficult to estimate the percent of the surface portion that is free of defects. FIG. 6 (prior art) is an SEM of a quartz surface that was firepolished and then treated with hydrofluoric acid; an electron beam at 30 degrees angle of incidence was used to produce the SEM. The surface is clearly resolved in the SEM of FIG. 6, in contrast to FIG. 5. Several regions that are free of defects are visible; one such region 50 is indicated with a reference numeral. Several elongate defects 55 are indicated. A number of circular defects 56 are indicated. The fraction of the surface portion area that is free of defects is estimated to be about 80 percent.

Figure 7:
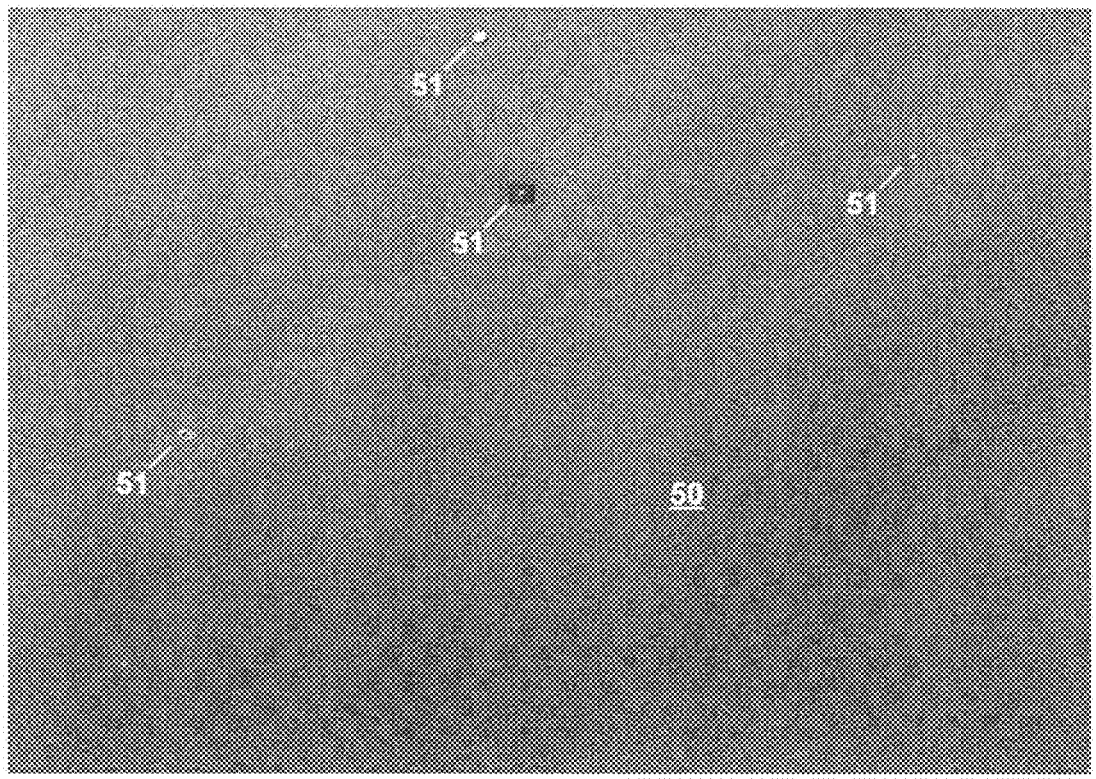
FIG. 7 is an SEM of a quartz surface that was firepolished and then treated with nitric acid; an electron beam at 90 degrees angle of incidence was used to produce the SEM.
Figure 8:
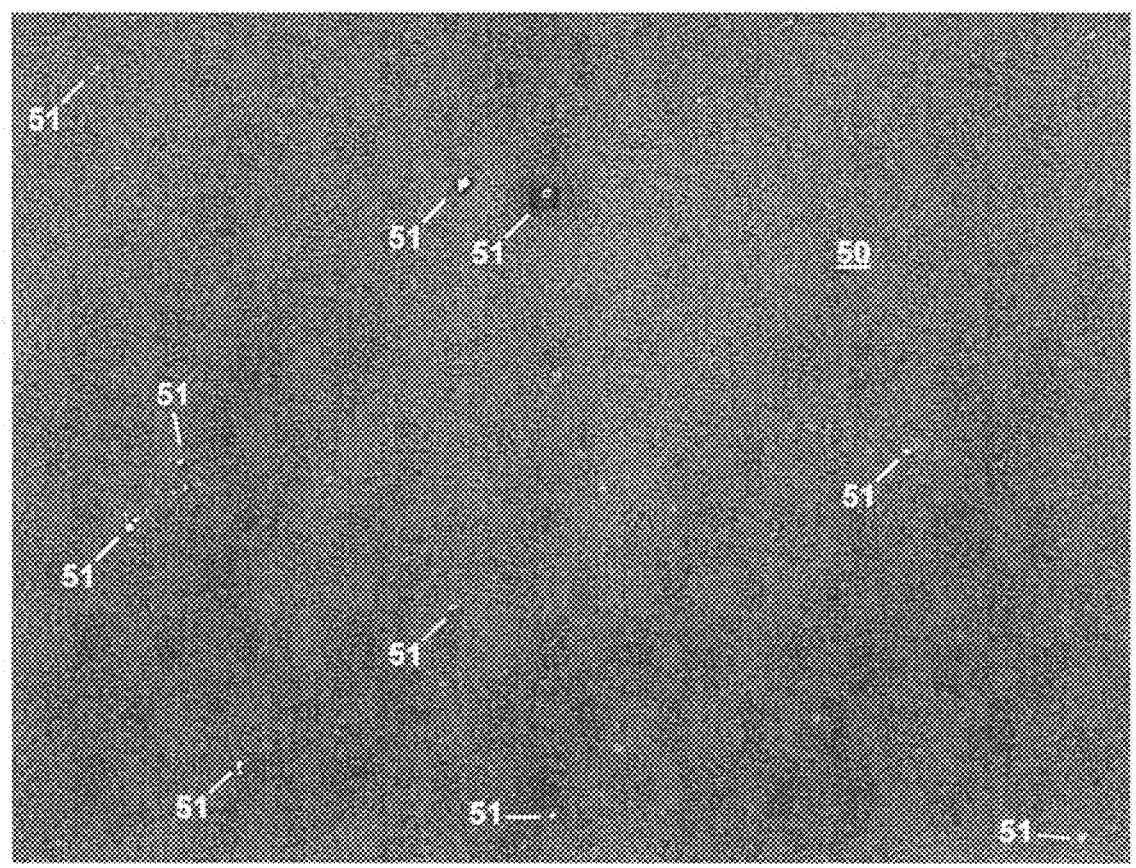
FIG. 8 is an SEM of a quartz surface that was firepolished and then treated with nitric acid; an electron beam at 30 degrees angle of incidence was used to produce the SEM.

FIG. 7 is an SEM of a quartz surface that was firepolished and then treated with nitric acid, in accordance with an embodiment. An electron beam at 90 degrees angle of incidence was used to produce the SEM of FIG. 7. A large region 50 that is free of defects occupies most of the SEM. Several defects 51 are indicated. FIG. 8 is an SEM of a quartz surface that was firepolished and then treated with nitric acid, in accordance with an embodiment. An electron beam at 30 degrees angle of incidence was used to produce the SEM of FIG. 8. A large region 50 that is free of defects occupies most of the SEM. Several defects 51 are indicated. The fraction of the surface portion area that is occupied by the defects 51 is about 0.2-0.3 percent. Thus, the fraction of the surface portion area that is free of defects is about 99.7 percent. Comparing FIG. 6 and FIG. 8, it is clear that the percent of the surface portion area that is free of defects is much higher in FIG. 8 than in FIG. 6.

While the present invention has been described in connection with specific embodiments, variations of these embodiments will be obvious to those of ordinary skill in the art. Therefore, the spirit and scope of the appended claims should not be limited to the foregoing description.

The invention claimed is:

1. A quartz part for use in semiconductor processing, the quartz part comprising:
   a surface, the surface including a surface portion to expose to a plasma, the surface portion having a surface portion area;
   wherein at least 95 percent of the surface portion area is free of defects, wherein a defect is a feature that interrupts a plane of the surface portion and is visible when viewed by scanning electron microscopy at a magnification of about 1,500× to 3,000×; and wherein the surface portion has less than E12 atoms per centimeter squared of aluminum.

2. The quartz part of claim 1, wherein at least 99 percent of the surface portion area is free of defects.

3. The quartz part of claim 1, wherein the surface portion has less than E12 atoms per centimeter squared of copper and the surface portion has less than E12 atoms per centimeter squared of iron and the surface portion has less than E12 atoms per centimeter squared of sodium and the surface portion has less than E12 atoms per centimeter squared of potassium.

4. The quartz part of claim 3, wherein at least 99 percent of the surface portion area is free of defects.

5. The quartz part of claim 3, wherein the surface portion has less than E11 atoms per centimeter squared of aluminum and the surface portion has less than E11 atoms per centimeter squared of copper and the surface portion has less than E11 atoms per centimeter squared of iron and the surface portion has less than E11 atoms per centimeter squared of sodium and the surface portion has less than E11 atoms per centimeter squared of potassium.

6. The quartz part of claim 5, wherein at least 99 percent of the surface portion area is free of defects.

7. A quartz part for use in semiconductor processing, the quartz part comprising:

a surface, the surface including a surface portion having a surface portion area, the surface portion produced by etching the surface with a plasma over the surface portion area and then firepolishing the plasma-etched surface portion area;

wherein at least 95 percent of the surface portion area is free of defects, wherein a defect is a feature that interrupts the surface portion and is visible when viewed by scanning electron microscopy at a magnification of about 1,5000× to 3,000×; and wherein the surface portion area has an average contamination level of less than E11 atoms per centimeter squared of aluminum.

8. The quartz part of claim 7, wherein at least 99 percent of the surface portion area is free of defects.

* * * * *